United States Patent
Peterson et al.

(10) Patent No.: US 8,502,555 B1
(45) Date of Patent: Aug. 6, 2013

(54) METHOD OF AND CIRCUIT FOR PREVENTING THE ALTERATION OF A STORED DATA VALUE

(75) Inventors: Edward S. Peterson, Rio Rancho, NM (US); James B. Anderson, Shallowater, TX (US); James Wesselkamper, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/535,610

(22) Filed: Jun. 28, 2012

(51) Int. Cl.
*G06F 11/30* (2006.01)
*H03K 19/00* (2006.01)

(52) U.S. Cl.
USPC .................................. 326/8; 326/37; 326/105

(58) Field of Classification Search
USPC ............................. 326/8–16, 37–38
See application file for complete search history.

(56) References Cited

U.S. PATENT DOCUMENTS

| | | | |
|---|---|---|---|
| 4,721,868 A * | 1/1988 | Cornell et al. ................. | 326/38 |
| 6,633,055 B2 | 10/2003 | Berlin et al. | |
| 7,200,064 B1 | 4/2007 | Boerstler et al. | |
| 7,485,944 B2 | 2/2009 | Kothandaraman et al. | |
| 7,501,879 B1 | 3/2009 | Oh et al. | |
| 7,567,449 B2 | 7/2009 | Paak et al. | |
| 7,598,749 B1 | 10/2009 | Ang et al. | |
| 7,724,022 B1 * | 5/2010 | Deskin et al. ..................... | 326/8 |
| 2008/0111579 A1 * | 5/2008 | Diluoffo et al. ................... | 326/8 |
| 2008/0191781 A1 | 8/2008 | Dixon et al. | |
| 2008/0217735 A1 | 9/2008 | Chen et al. | |
| 2010/0085075 A1 * | 4/2010 | Luzzi et al. ....................... | 326/8 |
| 2012/0081142 A1 * | 4/2012 | Weekly ............................. | 326/8 |

OTHER PUBLICATIONS

Alavi, Mohsen et al., "A PROM Element Based on Salicide Agglomeration of Poly Fuses in a CMOS Logic Process," *Technical Digest of the 1997 International Electron Devices Meeting*, Dec. 7, 1997, pp. 855-858, IEEE, Piscataway, New Jersey, USA.
Kalnitsky, Alexander et al., "CoSi$_2$ Integrated Fuses on Poly Silicon for Low Voltage 0.18μm CMOS Applications," *Technical Digest of the 1999 International Electron Devices Meeting*, Dec. 5, 1999, pp. 765-768, IEEE, Piscataway, New Jersey, USA.
Peterson, Ed, *Developing Tamper Resistant Designs with Xilinx Virtex-6 and 7 Series FPGAs*, XAPP1084 (v1.0), Sep. 21, 2011, pp. 1-17, Xilinx, Inc., San Jose, California, USA.
Suto, Hiroyuki et al., "Programming Conditions for Silicided Poly-Si or Copper Electrically Programmable Fuses," *IEEE 2007 International Integrated Reliability Workshop Final Report*, Oct. 15, 2007, pp. 84-89, IEEE, Piscataway, New Jersey, USA.

\* cited by examiner

*Primary Examiner* — Shawki Ismail
*Assistant Examiner* — Jany Richardson
(74) *Attorney, Agent, or Firm* — John J. King

(57) ABSTRACT

According to an embodiment, a method of preventing the alteration of a stored data value is disclosed. The method comprises coupling a first electronic fuse to an output control circuit; coupling a second electronic fuse to the output control circuit; decoding the states of the first electronic fuse and the second electronic fuse after a first processing step to generate a first decoded state; and decoding the states of the first electronic fuse and the second electronic fuse after a second processing step to generate a second decoded state different from the first decoded state; wherein the output control circuit maintains the second decoded state after an attempt to alter a state of an electronic fuse of the first electronic fuse and the second electronic fuse. A circuit for preventing the alteration of a stored data value is also described.

20 Claims, 6 Drawing Sheets

METHOD OF AND CIRCUIT FOR PREVENTING THE ALTERATION OF A STORED DATA VALUE

TECHNICAL FIELD

An embodiment relates generally to electronic circuits, and in particular, to a method of and circuit for preventing the alteration of a stored data value.

BACKGROUND

Integrated circuits are an important element of electronic devices. Many integrated circuits are programmed to store data which is necessary for the operation of the integrated circuit. Integrated circuits in a system may receive data from another integrated circuit. In some cases, data stored or used by an integrated circuit may be sensitive data. For example, it is important that data related to military, medical, financial, or other applications processing sensitive data be properly retained. In addition to preventing an adverse third party from accessing the data, it may also be helpful to prevent the data from being altered to cause the integrated circuit or system to operate differently. Significant measures may be taken to protect such sensitive data to ensure that the data is not accessed or altered.

However, adverse third parties may attempt to modify the means implemented to protect the sensitive data. By modifying the means implemented to protect the sensitive data, an adverse third party may access the sensitive data. That is, while conventional circuits may be implemented to protect sensitive data, those circuits may be altered or tampered with, thereby enabling access to the sensitive data. Accordingly, there is a need for a circuit or method which prevents access to sensitive data by preventing alteration of the means implemented to protect the sensitive data.

SUMMARY

According to an embodiment, a method of preventing the alteration of a stored data value is disclosed. The method comprises coupling a first electronic fuse to an output control circuit; coupling a second electronic fuse to the control circuit; decoding the states of the first electronic fuse and the second electronic fuse after a first processing step to generate a first decoded state; and decoding the states of the first electronic fuse and the second electronic fuse after a second processing step to generate a second decoded state different from the first decoded state; wherein the output control circuit maintains the second decoded state after an attempt to alter a state of an electronic fuse of the first electronic fuse and the second electronic fuse.

According to other embodiments, coupling the first electronic fuse and the second electronic fuse to the output control circuit may comprise coupling the first electronic fuse to a first input of an output AND gate and coupling the second electronic fuse to a second input comprising an inverted input of the output AND gate. Coupling the first electronic fuse to the output control circuit may comprise coupling a first plurality of electronic fuses to an enable control circuit, and the output of the enable control circuit is coupled to the first input of the output AND gate. Coupling the first plurality of electronic fuses to the enable control circuit may comprise coupling the first plurality of electronic fuses to an enable AND gate. Coupling the second electronic fuse to the output control circuit may comprise coupling a second plurality of electronic fuses to a disable control circuit, and the output of the disable control circuit is coupled to the inverted input of the output AND gate. Alternatively, the disable control circuit may comprise an OR gate. Each of the first electronic fuse and the second electronic fuse may be coupled to the output control circuit at a node between a supply voltage and a first terminal of the electronic fuse.

A circuit for preventing the alteration of a stored data value is also disclosed. The circuit comprises an output control circuit; a first electronic fuse coupled to the output control circuit; a second electronic fuse coupled to the output control circuit; wherein the output control circuit decodes the states of the first electronic fuse and the second electronic fuse after a first processing step to generate a first decoded state; decodes the states of the first electronic fuse and the second electronic fuse after a second processing step to generate a second decoded state different from the first decoded state; and maintains the second decoded state after an attempt to alter a state of an electronic fuse of the first electronic fuse and the second electronic fuse.

According to other embodiments, the first electronic fuse may be coupled to a first input of an output AND gate and the second electronic fuse may be coupled to a second input comprising an inverted input of the output AND gate. The circuit may further comprise a first plurality of electronic fuses coupled to an enable control circuit, wherein an output of the enable control circuit is coupled to the first input of the output AND gate. The enable control circuit may comprise an enable AND gate. The circuit may further comprise a second plurality of electronic fuses coupled to a disable control circuit, wherein the output of the disable control circuit is coupled to the inverted input of the output AND gate. The disable control circuit may comprise an OR gate. Each of the first electronic fuse and the second electronic fuse may be coupled to the output control circuit at a node between a supply voltage and a first terminal of the electronic fuse.

A circuit for preventing the alteration of a stored data value is also disclosed. The circuit comprise a first plurality of electronic fuses coupled to corresponding inputs of an enable AND gate; a second plurality of electronic fuses coupled to corresponding inputs of an OR gate; and a control circuit, an output of the enable AND gate being coupled to a first input of the control circuit; and an output of the OR gate being coupled to a second input of the control circuit; wherein a fixed output value is maintained at an output of the control circuit after an attempt to alter a state of an electronic fuse of the first plurality of electronic fuses and the second plurality of electronic fuses.

According to alternate embodiments, the control circuit comprises an output AND gate having a first input coupled to the enable AND gate and a second input comprising an inverted input coupled to the OR gate. For each electronic fuse of the first plurality of electronic fuses, the corresponding input of the enable AND gate may be coupled to a node between a reference voltage and a first terminal of the electronic fuse. Further, for each electronic fuse of the first plurality of electronic fuses, each node between the reference voltage and the electronic fuse coupled to the corresponding input of the AND gate may be pulled to a high voltage after blowing the first plurality of electronic fuses. For each electronic fuse of the second plurality of electronic fuses, the corresponding input of the OR gate is coupled to node between a reference voltage and a first node of the electronic fuse. For each electronic fuse of the second plurality of electronic fuses, each node between the reference voltage and the electronic fuse coupled to the corresponding input of the OR gate may be pulled to a high voltage after blowing the second plurality of electronic fuses.

DETAILED DESCRIPTION

Figure 1:
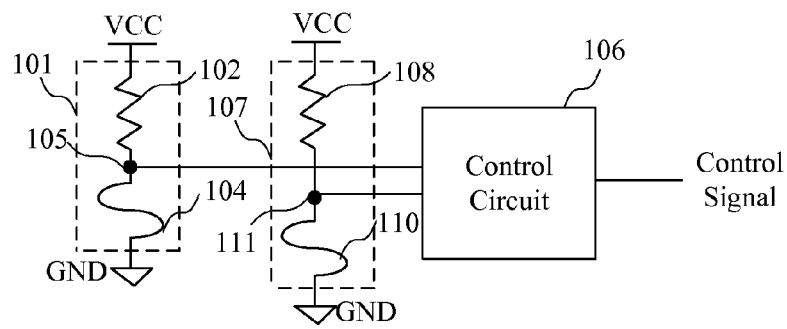
FIG. 1 is a block diagram of a circuit for preventing the alteration of a stored data value according to an embodiment.

Turning first to FIG. 1, a block diagram of a circuit for preventing the alteration of a stored data value according to an embodiment is shown. A first fuse element 101, comprising a resistor 102 and an electronic fuse 104, is coupled between a reference voltage (shown here as VCC) and a ground potential (GND). A first node 105 between the resistor 102 and the electronic fuse 104 is coupled to a first terminal of an output control circuit 106 which generates a control signal. A second fuse element 107 comprising a resistor 108 and an electronic fuse 110 is coupled between the reference voltage and ground potential. A second node 111 between the resistor 108 and the electronic fuse 110 is coupled to a second terminal of the control circuit 106.

An electronic fuse is "blown" (i.e. providing a path of high resistance or an open circuit) when a current is applied to the electronic fuse that causes a reduced current path or an open circuit. That is, the current path provided by a polysilicon or metal material, for example, can be altered by applying a current through the current path. The electronic fuses are implemented in a circuit to store data values. The data values may be the values at the nodes 105 and 111, and may be altered if the fuse coupled to the node is blown. As will be described in more detail below, the control circuit 106 enables decoding the states of the first electronic fuse 104 and the second electronic fuse 110 after a first processing step to generate a first decoded state and after a second processing step to generate a second decoded state. The control circuit maintains the second decoded state (and therefore the output control signal) after an attempt to alter a state of an electronic fuse of the first electronic fuse and the second electronic fuse.

More particularly, the circuit of FIG. 1 adds protection to an already blown electronic fuse to prevent resistance degradation. Conventional electronic fuses are susceptible to aging, where an electronic fuse may actually "grow back" over time, causing the resistance of the fuse to change over time. For example, the electronic fuse can grow back as a result of electro-migration due to repeated reading, or due to thermal effects. The thermal effects can have an impact even if the integrated circuit is not turned on, but is stored at high temperature. An adversary may try to accelerate these effects and speed up the aging process in order to "re-close" an electronic fuse and place the circuit in a state which is not secure. The circuits of FIGS. 1-3 protects against both a deliberate attack and the natural aging effect so that a device will not become less secure or vulnerable to attack over time.

Figure 2:
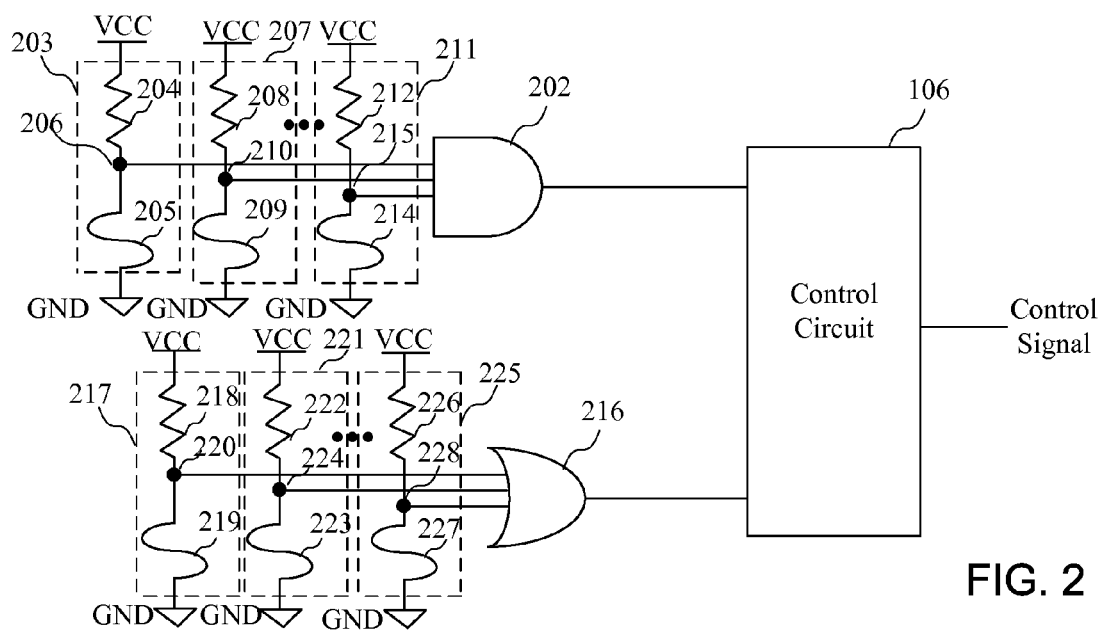
FIG. 2 is a block diagram of a circuit for preventing the alteration of a stored data value according to an alternate embodiment.
Figure 3:
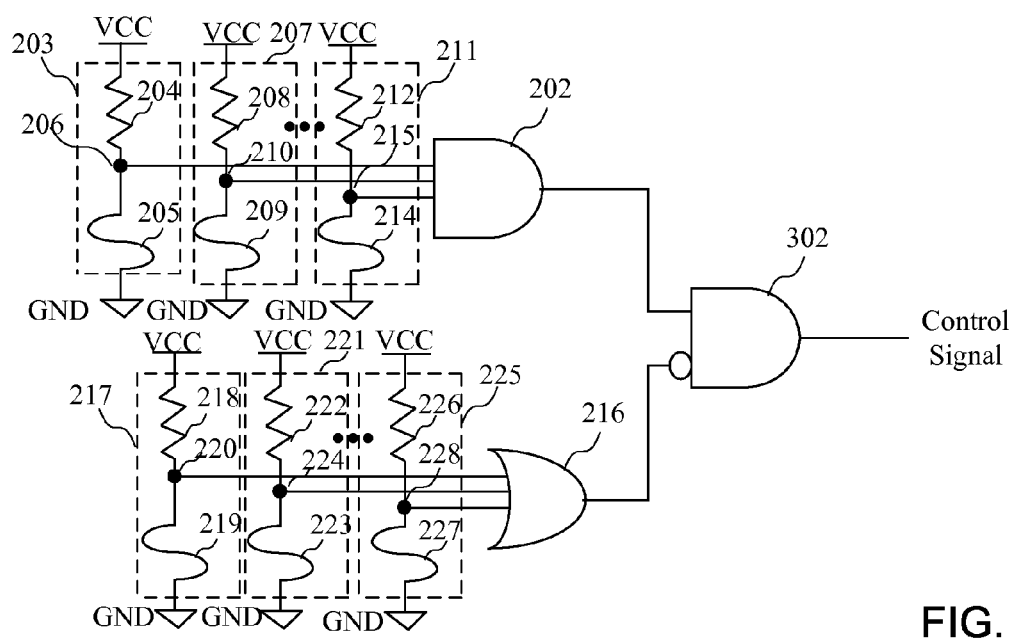
FIG. 3 is a block diagram of a circuit for preventing the alteration of a stored data value according to a further alternate embodiment.

Electronic fuses may be used as security critical control bits. The use of electronic fuses to hold non-volatile information such as control data is highly desired in security critical applications. For example, an electronic fuse may be used to generate a bit that prevents the reading back of a decryption key in an integrated circuit. Further, unlike the case of battery-backed RAM, a battery would not be required. The circuits of FIGS. 1-3 are particularly useful whenever there is an electronic fuse-based control signal that needs to be set in a particular state for a short term, but then returned to its default (e.g. secure) state. For example, a user may want to initially set the output state of the control signal equal to a logical "1" to enable a programming phase or some other operation which may only be implemented by an authorized entity. Before fielding a product, the output state of the control signal would then be returned to a value of a logical "0." By way of example, the circuits of FIGS. 1-3 could be used as an enable/disable for a JTAG communication chain, an enable/disable for new silicon test features, or an enable/disable for an encryption/decryption algorithm.

In operation, the control signal, which could be an enable signal, is set at a default value equal to a logical "0" (e.g. to disable a circuit which is controls). To generate a control signal value equal to a logical "1" (to enable the circuit), the enable fuse 104 is blown, causing an open circuit between the resistor 102 and ground, where the node 105 is pulled to a high voltage (i.e. a voltage close to VCC). Accordingly, the inputs to the control circuit are in a first state (i.e. a logical "1" at node 105 and a logical "0" at node 111) after a first processing step. The control circuit will detect the first state, and generate the desired control signal at the output of the control circuit 106 (i.e. a control signal having a logical "1" value). To generate a disable signal during the second mode of operation, the fuse 110 is blown, causing an open circuit between the resistor 108 and ground at the node 111 to pull the node to a high voltage. That is, the control circuit 106 will detect a logical "1" at each of the nodes 105 and 111, and generate a different value of a control signal (i.e. a control signal having a logical "0" value). Accordingly, the control signal can enable a certain circuit during a first mode of operation of an integrated circuit or system, such as a start-up or test mode, and disable the circuit during a second mode of operation.

While third-party adversaries may attempt alter the control signal by taking advantage of properties of the electronic fuses 104 and 110, the control circuit will detect any attempt to alter a fuse. Any attempt to alter the state of one fuse (e.g. fuse 110) will likely alter the other fuse (e.g. fuse 104). Therefore, any attempt to enable a circuit by generating an enable signal (i.e. the control signal equal to a logic "1") after the second programming stage would likely fail. That is, because any attempt to regrow the fuse 110 (which would result in the control signal being equal to a logical "1" as required during the first state) would likely also alter the first fuse 104 (which would result in the control signal being a logical "0"). Therefore, it would be difficult to generate the inputs to the control circuit necessary to generate the appropriate control signal to enable the circuit as desired during the first mode of operation. While only two fuse elements are shown in the embodiment of FIG. 1, it should be understood that additional fuses could be implemented, where the control circuit 106 would generate an appropriate control signal based upon the various signals generated at the nodes of the fuse elements. Because two different combinations of signals at the nodes of the fuse elements would be used to generate different control signals in different modes, any attempt to alter one or more fuses to change the control signal will likely result in the alteration of other fuses, and therefore fail to generate the desired control signal.

According to the alternate embodiment of FIG. 2, the ability to alter the control signal can be further reduced by implementing a plurality of electronic fuse to generate the signals to each of the two inputs of the control circuit 106. As shown in FIG. 2, a plurality of fuse elements are provided to an AND gate 202. In particular, a first fuse element 203 comprises a resistor 204 which is coupled to a fuse 205 at a node 206. The node 206 is coupled to a first input of the AND gate 202. A second fuse element 207 comprises a resistor 208 which is coupled to a fuse 209 at a node 210. The node 210 is coupled to a second input of the AND gate 202. A third fuse element 211 comprises a resistor 212 which is coupled to a fuse 214 at a node 215. The node 215 is coupled to a third input of the AND gate 202. As will be described in more detail below, the fuse elements 203, 207 and 211 comprise enable fuses, and the AND gate 202 comprises an enable control circuit. To generate a control signal to enable a circuit, all of the fuses of the fuse elements coupled to the AND gate 202 are blown. By blowing the fuses, the paths to ground through the fuses are eliminated, pulling each of the nodes 206, 210 and 215 to a high voltage. Because a logic "1" will be provided to each input of the AND gate 202, a logical "1" will be generated at the output of the AND gate 202.

A second plurality of fuse elements is provided to an OR gate 216. In particular, a fourth fuse element 217 comprises a resistor 218 and a fuse 219 which are coupled at a node 220. The node 220 is coupled to a first input of the OR gate 216. A fifth fuse element 221 comprises a resistor 222 and a fuse 223 which are coupled at a node 224. The node 224 is coupled to a second input of the OR gate 216. A sixth fuse element 225 comprises a resistor 226 and a fuse 227 which are coupled at a node 228. The node 228 is coupled to a third input of the OR gate 216. While three fuse elements are shown in the embodiment of FIG. 2, it should be understood that additional fuse elements could be implemented as desired to ensure that the control signal is not altered through aging or by a third party adversary. As will be described in further detail, the fuse elements 217, 221, and 225 comprise disable fuses, and the OR gate 216 comprises a disable control circuit.

In order to generate a first signal as the control signal, the fuse of each of the fuse elements 203, 207 and 211 is blown to generate a logical "1" at each input of the AND gate 202. None of the fuses of the fuse elements 217, 221 and 225 coupled to the OR gate 216 are blown during the first processing step. Because all of the inputs to the OR gate 216 are logical "0s," the output of the OR gate 216 is a logical "0." Therefore, after a first processing step in a first mode of operation, a logical "1" is coupled to the first input of the control circuit 106 and a logical "0" is coupled to the second input of the control circuit 106. In order to generate a second signal as the control signal in a second mode of operation, all of the fuses of the fuse elements 217, 221 and 225 are blown, resulting in a logical "1" at the output of the OR gate 216. Accordingly, the control circuit 106 will detect a logical "1" at each input the control circuit 106.

However, a third party adversary may desire to return the state of the control signal to the first state (i.e. a logical "1" to enable a certain circuit) as in the first mode of operation. According to the embodiment of FIG. 2, any aging or attempt by a third party adversary to alter the control signal at the output of the control circuit 106 would require that all of the fuses of the fuse elements coupled to the OR gate 302 are grown back without growing back any of the fuse elements coupled to the AND gate 202. That is, the OR gate 216 will not generate a logical "0" at the output of the OR gate 216 (necessary to generate a logical "1" as the control signal) unless all of the fuses of the fuse elements 217, 221, and 225 are grown back. Further, in any attempt to grow back the fuses of the fuse elements coupled to the OR gate 216, it would be necessary to prevent any of the fuses of the fuse elements 203, 207, and 211 to grow back. That is, if a single fuse of the fuse elements 203, 207, and 211 grows back, the output of the AND gate could change to a logical "0," resulting in a logical "0" being generated at the output of the AND gate 202. Accordingly, once both the "enable" electronic fuses coupled to the AND gate 202 and "disable" electronic fuses coupled to the OR gate 216 are blown, the output state remains stable (equal to the default "un-blown" state) and is immune to aging or any attempt to alter the control signal by an adversary. Therefore, the circuit of FIG. 2 prevents any effects of aging or a deliberate attempt to alter the control signal.

As shown in the embodiment of FIG. 3, the control circuit 106 may be implemented using an AND gate 302 adapted to invert the output of the OR gate 216. When generating a logical "1" as the control signal enabling a circuit in a first mode of operation, all of the fuses are blown to generate of logical "1" at the output of the AND gate 202. Because all of the fuses of the fuse elements coupled to the OR gate 216 are not blown in the first mode of operation, logical "0s" are provided to each of the inputs of the OR gate 216 to generate a logical "0" at the output of the OR gate 216. Because the output of the OR gate 216 is inverted at the input of the AND gate 302, a logical "1" is generated as the control signal at the output of the AND gate 302. When all of the fuses of the fuse elements coupled to the inputs of the OR gate 216 are blown to generate a second control signal during a second mode of operation, a logical "1" is generated at the output of the OR gate 216. Therefore, a logical "0" is generated as the control signal at the output of the AND gate 302. When an adversary attempts to change the output of the OR gate 216, it would be necessary to grow back all of the fuses of the fuse elements coupled to the OR gate 216 without growing back any of the fuses of the fuse elements coupled to the AND gate 202 as set forth above with respect to FIG. 2. The circuits of FIGS. 1-3 could be applied to any type of control data stored using an electronic fuse that would cause harm if it were to change over time or through alteration by an adversary. While stability of the control signal improves by increasing the number of number of electronic fuses which are used, additional electronic fuses add area and complexity. Therefore, an appropriate number of fuses can be selected to provide the appropriate immunity to aging or deliberate attempts to alter a control signal by an adversary.

Figure 4:
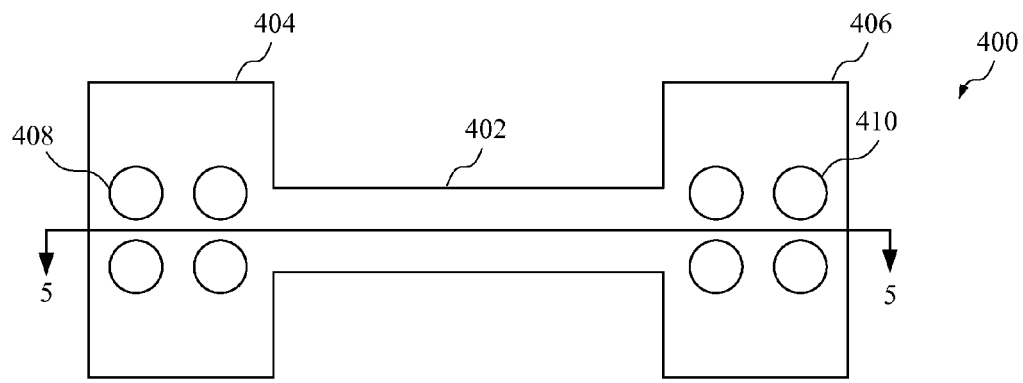
FIG. 4 is a top plan view of a portion of an integrated circuit showing an electronic fuse according to an embodiment.
Figure 5:
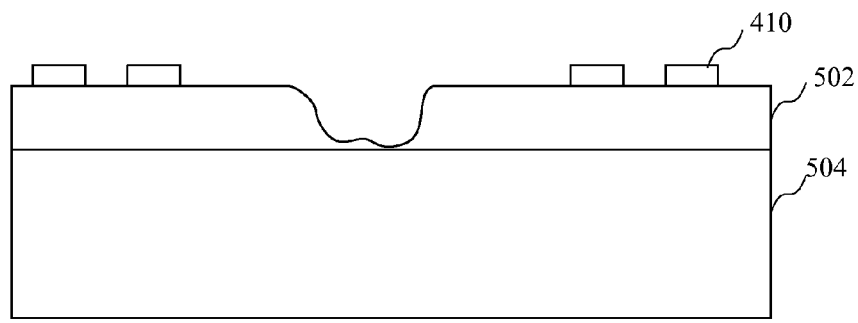
FIG. 5 is a cross-sectional view of the electronic fuse of the embodiment of FIG. 4.

Turning now to FIG. 4, a top plan view of a portion of an integrated circuit shows an electronic fuse according to an embodiment. The electronic fuse of FIG. 4, which may be implemented in the embodiments of FIGS. 1-3, comprises a fuse portion 402 coupled between contact portions 404 and 406. Contacts 408 of the contact portion 404 and contacts 410 of the contact portion 406 enable the application of an appropriate current through the fuse portion 402. As is apparent in the cross-sectional view of FIG. 5 taken at lines 5-5 of FIG. 4, a poly-silicon layer 502 on a substrate 504 is altered as a result of excessive current in the fuse, resulting in a structure as shown in FIG. 5 which prevents current from flowing. Accordingly, after a process step to blow the fuse, the fuse portion 402 effectively becomes an open circuit between the contact portion 404 and the contact portion 410.

Figure 6:
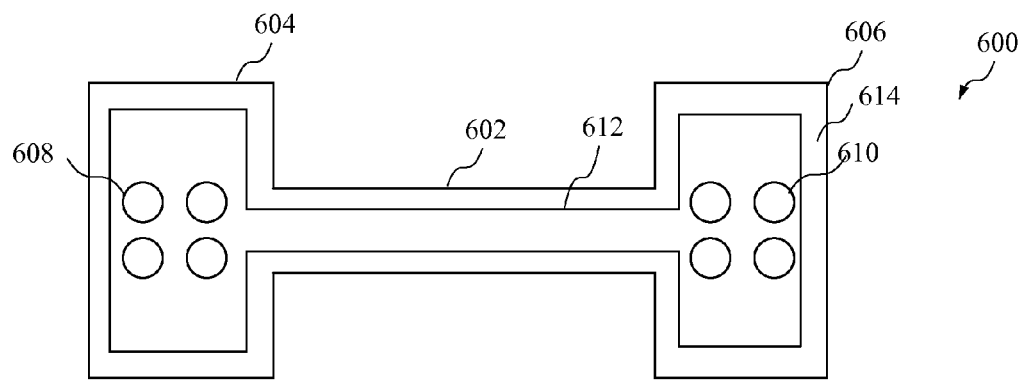
FIG. 6 is a top plan view of a metal-type electronic fuse according to an alternate embodiment.
Figure 7:
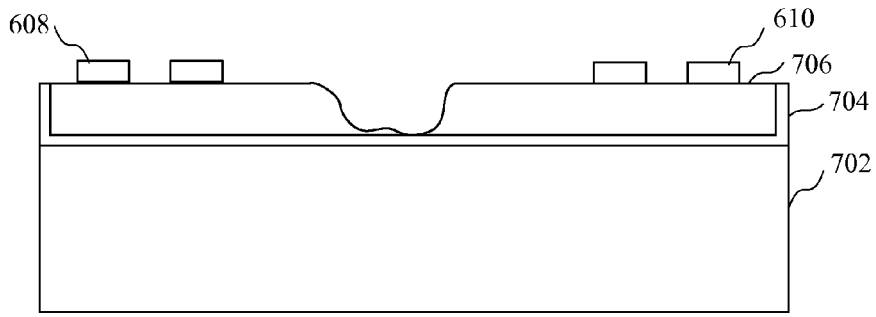
FIG. 7 is a cross-sectional view of the metal-type electronic fuse of the embodiment of FIG. 6.

According to an alternate embodiment of FIG. 6, a metal-type electronic fuse may be implemented in the various embodiments of FIGS. 1-3. As shown in FIG. 6, a fuse portion 602 is coupled between contact portions 604 and 606. Contacts 608 of the contact portion 604 and contacts 610 of the contact portion 606 enable the application of an appropriate current through the fuse portion 602 to blow the fuse. The metal-type electronic fuse 600 of FIG. 6 comprises a metal 612, such as copper, within a metal barrier 614. As shown in the cross-sectional view of FIG. 7, the metal 612 is altered as a result of a certain current being applied to the contacts 608 and 610. Because the electrical path through the metal 612 is reduced, the altered structure prevents current from flowing, and effectively becomes an open circuit between contacts 608 and contacts 610. It should be noted that the aging effect is more pronounced in newer generation metal electronic fuses than in poly-type electronic fuses, and that the circuit and methods for preventing the alteration of a stored data value are particularly beneficial in circuits implementing metal-type contacts.

Figure 8:
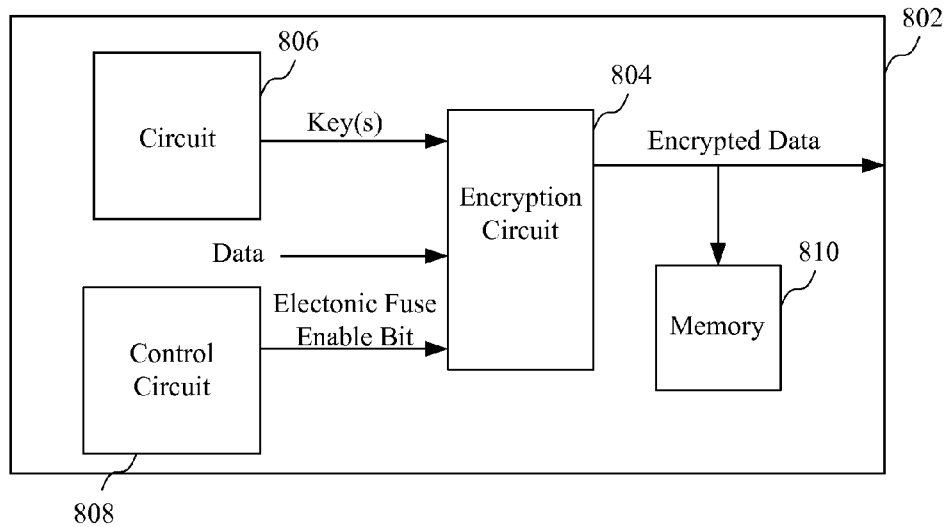
FIG. 8 is a block diagram of a circuit implementing a circuit for preventing the alteration of a stored data value according to an embodiment.

Turning now to FIG. 8, a block diagram of a circuit 802 for implementing a circuit for preventing the alteration of a stored data value according to an embodiment is shown. The circuit 802 relates to a circuit for encrypting data using electronic keys, for example. An encryption circuit 804 is coupled to receive data to be encrypted, as well as keys required by the encryption circuit 804 from a circuit 806, and an electronic fuse enable bit from a control circuit 808. The control circuit 808 could be implemented using any of the circuits of FIGS. 1-7, for example, where the electronic fuse enable bit would be generated as the control signal output by the circuits of FIGS. 1-3. Encrypted data is generated by the encryption circuit 804, and may be stored in a memory 810. While the circuit of FIG. 8 is one type of circuit which could benefit from the electronic fuses and control circuits of FIGS. 1-3, the electronic fuses and control circuits of FIGS. 1-3 could be implemented in a variety of applications which would employ electronic fuses and would be adversely affected by the alteration of a fuse through aging or a deliberate attempt to alter a fuse by a third party adversary.

Figure 9:
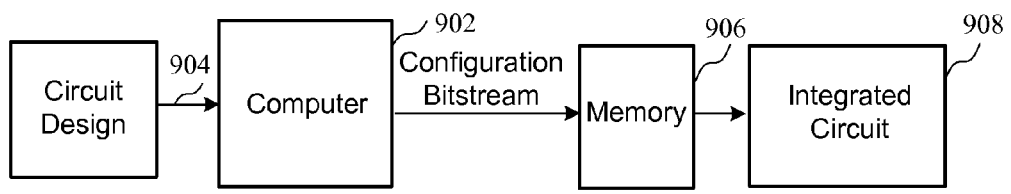
FIG. 9 is a block diagram of a system for programming a device having programmable resources according to an embodiment.

Turning now to FIG. 9, a block diagram of a system for programming a device having programmable resources according to an embodiment is shown. In particular, a computer 902 is coupled to receive a circuit design 904 from a memory 906, and generate a configuration bitstream which is stored in the non-volatile memory 906. As will be described in more detail below, the circuit design may be a high level design, such as a circuit design defined in a hardware description language (HDL). Also, the computer may be configured to run software that generates a configuration bitstream which is stored in the non-volatile memory 906. The configuration bitstream may be provided to the integrated circuit 908, which may be an integrated circuit having programmable resources as described in reference to FIG. 10.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 902 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 10:
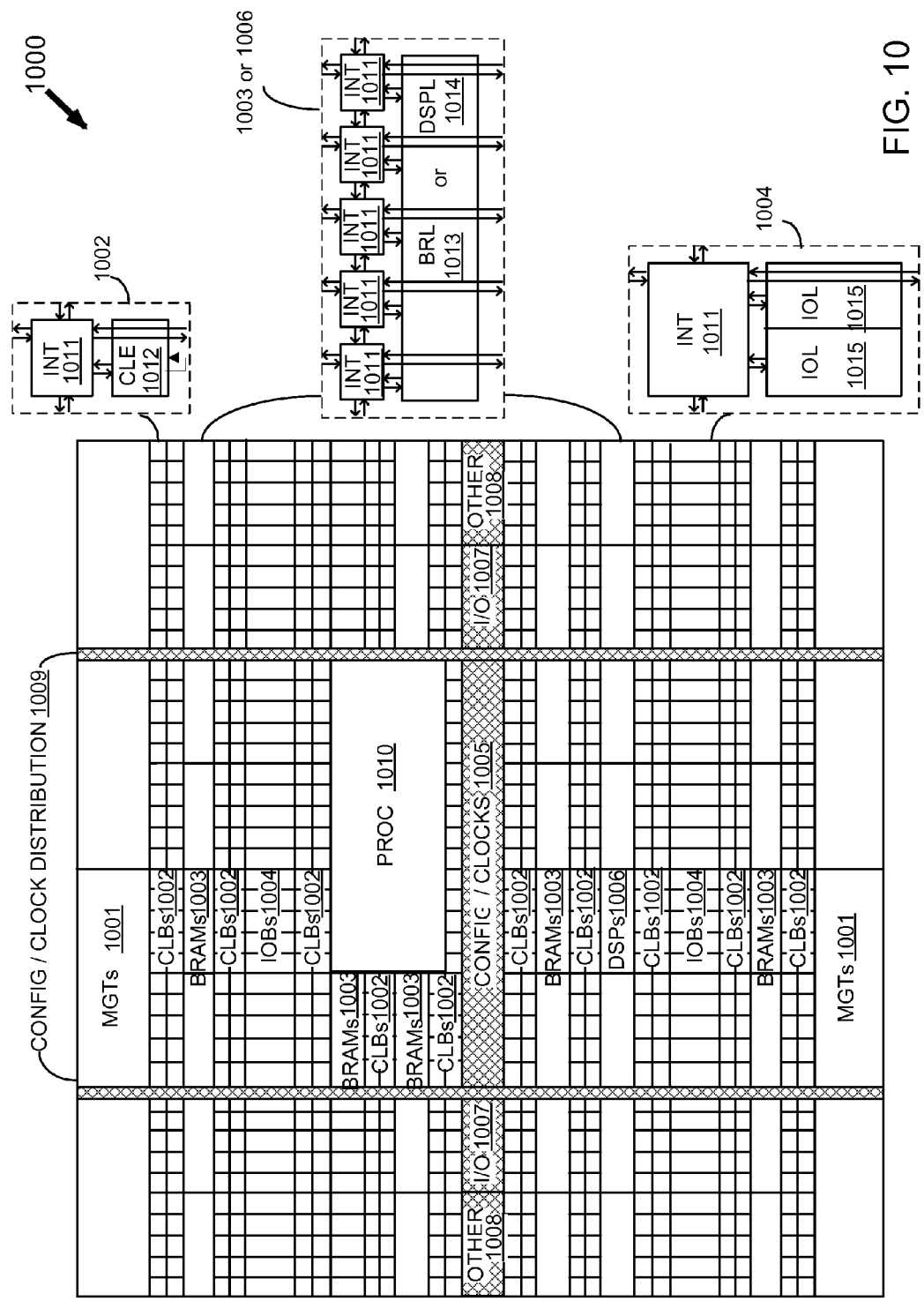
FIG. 10 is a block diagram of a device having programmable resources according to an embodiment.

Turning now to FIG. 10, a block diagram of a device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1006 may include a DSP logic element (DSPL) 1014 in addition to an appropriate number of programmable interconnect elements. An IOB 1004 may include, for example, two instances of an input/output logic element (IOL) 1015 in addition to one instance of the programmable interconnect element 1011. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 1009 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the embodiment of FIG. 10 relates to an integrated circuit having programmable resources, it should be understood that the circuits and methods set forth in more detail below could be implemented in any type of ASIC.

Figure 11:
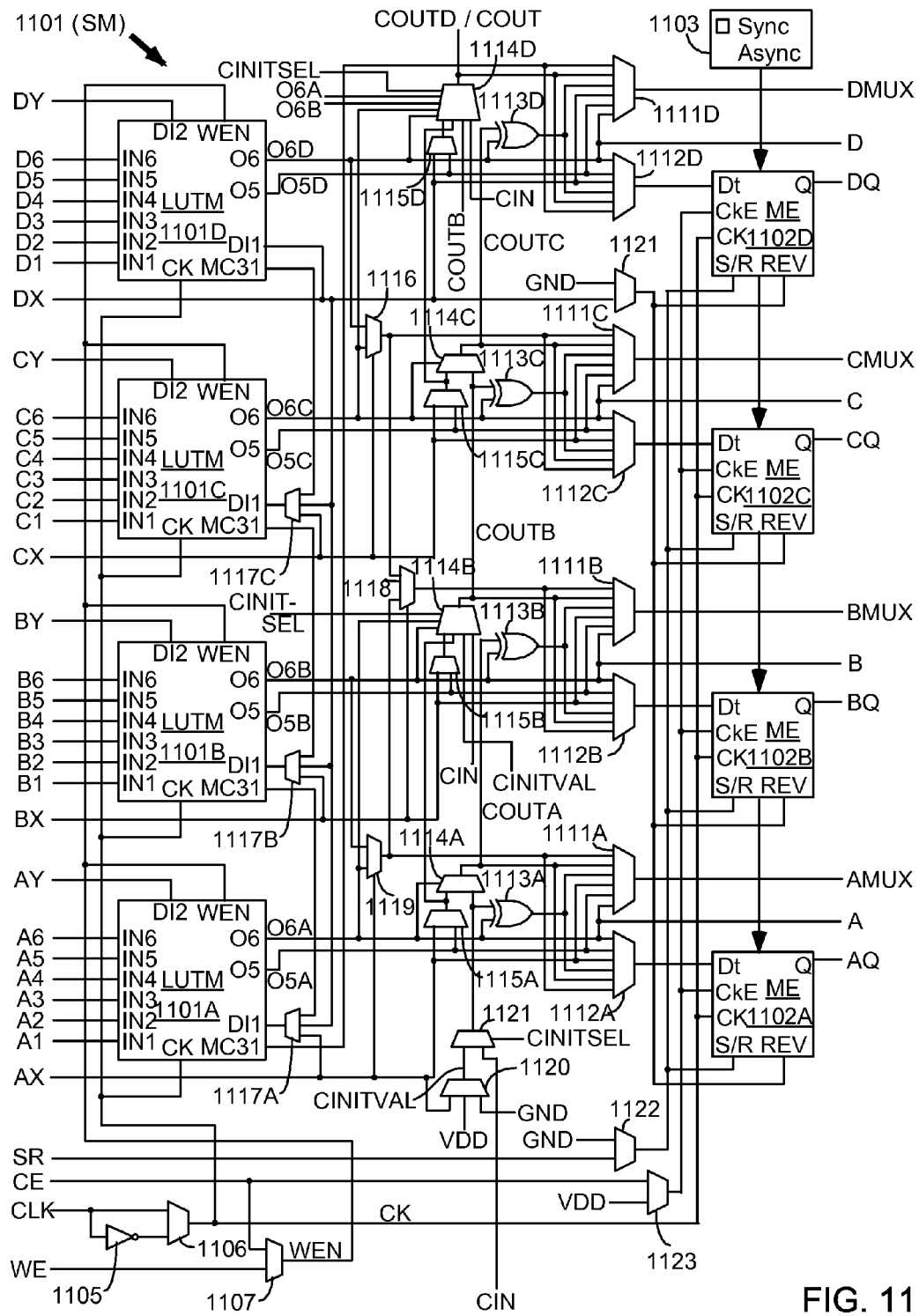
FIG. 11 is block diagram of a configurable logic element of the device of FIG. 10 according to an embodiment.

Turning now to FIG. 11, a block diagram of a configurable logic element of the device of FIG. 11 according to an embodiment is shown. In particular, FIG. 11 illustrates in simplified form a configurable logic element of a configuration logic block 1002 of FIG. 10. In the embodiment of FIG. 11, slice M 1101 includes four lookup tables (LUTMs) 1101A-1101D, each driven by six LUT data input terminals A1-A6, B1-B6, C1-C6, and D1-D6 and each providing two LUT output signals O5 and O6. The O6 output terminals from LUTs 1101A-1101D drive slice output terminals A-D, respectively. The LUT data input signals are supplied by the FPGA interconnect structure via input multiplexers, which may be implemented by programmable interconnect element 1111, and the LUT output signals are also supplied to the interconnect structure. Slice M also includes: output select multiplexers 1111A-1111D driving output terminals AMUX-DMUX; multiplexers 1112A-1112D driving the data input terminals of memory elements 1102A-1102D; combinational multiplexers 1116, 1118, and 1119; bounce multiplexer circuits 1122-1123; a circuit represented by inverter 1105 and multiplexer 1106 (which together provide an optional inversion on the input clock path); and carry logic having multiplexers 1114A-1114D, 1115A-1115D, 1120-1121 and exclusive OR gates 1113A-1113D. All of these elements are coupled together as shown in FIG. 11. Where select inputs are not shown for the multiplexers illustrated in FIG. 11, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 11 for clarity, as well as from other selected figures herein.

In the pictured embodiment, each memory element 1102A-1102D may be programmed to function as a synchronous or asynchronous flip-flop or latch. The selection between synchronous and asynchronous functionality is made for all four memory elements in a slice by programming Sync/Asynch selection circuit 1103. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1102A-1102D are clocked by a clock signal CK, which may be provided by a global clock network or by the interconnect structure, for example. Such programmable memory elements are well known in the art of FPGA design. Each memory element 1102A-1102D provides a registered output signal AQ-DQ to the interconnect structure. Because each LUT 1101A-1101D provides two output signals, O5 and O6, the LUT may be configured to function as two 5-input LUTs with five shared input signals (IN1-IN5), or as one 6-input LUT having input signals IN1-IN6.

In the embodiment of FIG. 11, each LUTM 1101A-1101D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1117A-1117C for LUTs 1101A-1101C), or to the two 32-bit RAMs via input terminals DI1 and DI2. RAM write operations in the LUT RAMs are controlled by clock signal CK from multiplexer 1106 and by write enable signal WEN from multiplexer 1107, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1101A may also be provided to the general interconnect structure for shift register chaining, via output select multiplexer 1111D and CLE output terminal DMUX. Accordingly, the circuits and methods set forth above may be implemented in a device such as the devices of FIGS. 10 and 11, or any other suitable device.

Figure 12:
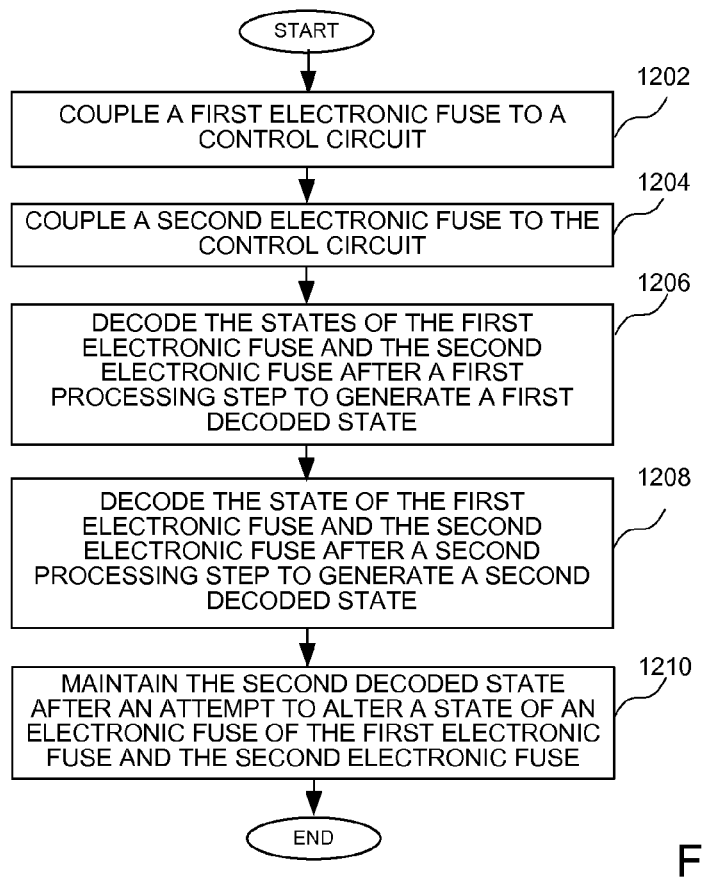
FIG. 12 is a flow chart showing a method of preventing the alternation of a stored data value according to an embodiment.

Turning now to FIG. 12, a flow chart shows a method of preventing the alternation of a stored data value according to an embodiment. In particular, a first electronic fuse is coupled to a control circuit at a step 1202. A second electronic fuse is coupled to the control circuit at a step 1204. The states of the first electronic fuse and the second electronic fuse are decoded after a first processing step to generate a first decoded state at a step 1206. The state of the first electronic fuse and the second electronic fuse are decoded after a second processing step to generate a second decoded state at a step 1208. The second decoded state is maintained after an attempt to alter a state of an electronic fuse of the first electronic fuse and the second electronic fuse at a step 1210.

Figure 13:
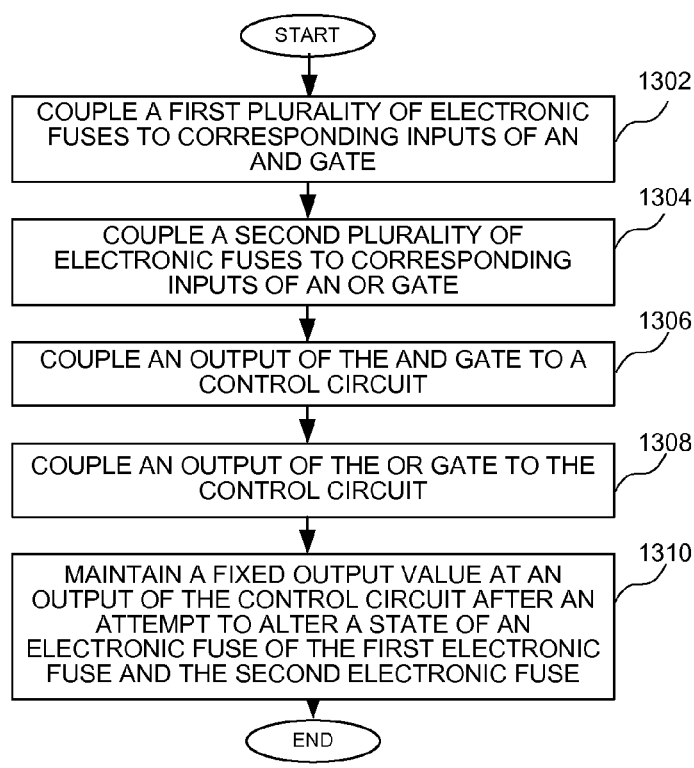
FIG. 13 is a flow chart showing a method of preventing the alternation of a stored data value according to an alternate embodiment.

Turning now to FIG. 13, a flow chart shows a method of preventing the alternation of a stored data value according to an alternate embodiment. A first plurality of electronic fuses is coupled to corresponding inputs of an AND gate at a step 1302. A second plurality of electronic fuses is coupled to corresponding inputs of an OR gate at a step 1304. An output of the AND gate is coupled to a control circuit at a step 1306. An output of the OR gate is coupled to the control circuit at a step 1308. A fixed output value is maintained at an output of the control circuit after an attempt to alter a state of an electronic fuse of the first electronic fuse and the second electronic fuse at a step 1310.

It can therefore be appreciated that a new method of and circuit for preventing the alteration of a stored data value has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of preventing the alteration of a stored data value, the method comprising:
   coupling a first electronic fuse to an output control circuit;
   coupling a second electronic fuse to the output control circuit;
   decoding the states of the first electronic fuse and the second electronic fuse after a first processing step to generate a first decoded state; and
   decoding the states of the first electronic fuse and the second electronic fuse after a second processing step to generate a second decoded state different from the first decoded state prior to an attempt to alter a state of an electronic fuse of the first electronic fuse and the second electronic fuse;
   wherein the output control circuit maintains the second decoded state after the attempt to alter the state of the electronic fuse of the first electronic fuse and the second electronic fuse.

2. The method of claim 1 wherein coupling the first electronic fuse and the second electronic fuse to the output control circuit comprises coupling the first electronic fuse to a first input of an output AND gate and coupling the second electronic fuse to a second input comprising an inverted input of the output AND gate.

3. The method of claim 2 wherein coupling the first electronic fuse to the output control circuit comprises coupling a first plurality of electronic fuses to an enable control circuit, and the output of the enable control circuit is coupled to the first input of the output AND gate.

4. The method of claim 3 wherein coupling the first plurality of electronic fuses to the enable control circuit comprises coupling the first plurality of electronic fuses to an enable AND gate.

5. The method of claim 2 wherein coupling the second electronic fuse to the output control circuit comprises coupling a second plurality of electronic fuses to a disable control circuit, where the output of the disable control circuit is coupled to the inverted input of the output AND gate.

6. The method of claim 5 wherein the disable control circuit comprises an OR gate.

7. The method of claim 1 wherein each of the first electronic fuse and the second electronic fuse is coupled to the output control circuit at a node between a supply voltage and a first terminal of the electronic fuse.

8. A circuit for preventing the alteration of a stored data value, the circuit comprising:
   an output control circuit;
   a first electronic fuse coupled to the output control circuit;
   a second electronic fuse coupled to the output control circuit;
   wherein the output control circuit decodes the states of the first electronic fuse and the second electronic fuse after a first processing step to generate a first decoded state; decodes the states of the first electronic fuse and the second electronic fuse after a second processing step to generate a second decoded state different from the first decoded state prior to an attempt to alter a state of an electronic fuse of the first electronic fuse and the second electronic fuse; and maintains the second decoded state after the attempt to alter the state of the electronic fuse of the first electronic fuse and the second electronic fuse.

9. The circuit of claim 8 wherein the first electronic fuse is coupled to a first input of an output AND gate and the second electronic fuse is coupled to a second input comprising an inverted input of the output AND gate.

10. The circuit of claim 9 comprising a first plurality of electronic fuses coupled to an enable control circuit, wherein an output of the enable control circuit is coupled to the first input of the output AND gate.

11. The circuit of claim 10 wherein the enable control circuit comprises an enable AND gate.

12. The circuit of claim 9 further comprising a second plurality of electronic fuses coupled to a disable control circuit, wherein the output of the disable control circuit is coupled to the inverted input of the output AND gate.

13. The circuit of claim 12 wherein the disable control circuit comprises an OR gate.

14. The circuit of claim 8 wherein each of the first electronic fuse and the second electronic fuse is coupled to the output control circuit at a node between a supply voltage and a first terminal of the electronic fuse.

15. A circuit for preventing the alteration of a stored data value, the circuit comprising:
   a first plurality of electronic fuses coupled to corresponding inputs of an enable AND gate;
   a second plurality of electronic fuses coupled to corresponding inputs of an OR gate; and
   a control circuit, an output of the enable AND gate being coupled to a first input of the control circuit and an output of the OR gate being coupled to a second input of the control circuit;
   wherein a fixed output value is maintained at an output of the control circuit after an attempt to alter a state of an electronic fuse of the first plurality of electronic fuses and the second plurality of electronic fuses.

16. The circuit of claim 15 wherein the control circuit comprises an output AND gate having a first input coupled to the enable AND gate and a second input comprising an inverted input coupled to the OR gate.

17. The circuit of claim 15 wherein, for each electronic fuse of the first plurality of electronic fuses, the corresponding input of the enable AND gate is coupled to a node between a reference voltage and a first terminal of the electronic fuse.

18. The circuit of claim 17 wherein, for each electronic fuse of the first plurality of electronic fuses, each node between the reference voltage and the electronic fuse coupled to the corresponding input of the enable AND gate is pulled to a high voltage after blowing the first plurality of electronic fuses.

19. The circuit of claim 15 wherein, for each electronic fuse of the second plurality of electronic fuses, the corresponding input of the OR gate is coupled to a node between a reference voltage and a first node of the electronic fuse.

20. The circuit of claim 19 wherein, for each electronic fuse of the second plurality of electronic fuses, each node between the reference voltage and the electronic fuse coupled to the corresponding input of the OR gate is pulled to a high voltage after blowing the second plurality of electronic fuses.

* * * * *